United States Patent
Chatterjee et al.

(10) Patent No.: US 10,658,574 B2
(45) Date of Patent: May 19, 2020

(54) SYNTHETIC ANTIFERROMAGNETIC LAYER, MAGNETIC TUNNEL JUNCTION AND SPINTRONIC DEVICE USING SAID SYNTHETIC ANTIFERROMAGNETIC LAYER

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); UNIVERSITE GRENOBLE ALPES, Saint Martin D'Heres (FR)

(72) Inventors: Jyotirmoy Chatterjee, West Bengal (IN); Bernard Dieny, Lans en Vercors (FR); Ricardo Sousa, Grenoble (FR); Stéphane Auffret, Vaulnaveys le Haut (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); UNIVERSITE GRENOBLE ALPES, Saint Martin D'Heres (FR)

( * ) Notice: Subject to any disclaimer, the term of this patent is extended or adjusted under 35 U.S.C. 154(b) by 57 days.

(21) Appl. No.: 16/100,484

(22) Filed: Aug. 10, 2018

(65) Prior Publication Data
US 2019/0051822 A1 Feb. 14, 2019

(30) Foreign Application Priority Data
Aug. 10, 2017 (EP) .................................... 17306063

(51) Int. Cl.
*H01L 43/10* (2006.01)
*H01L 43/02* (2006.01)
(Continued)

(52) U.S. Cl.
CPC .............. *H01L 43/10* (2013.01); *G11C 11/16* (2013.01); *G11C 11/161* (2013.01);
(Continued)

(58) Field of Classification Search
CPC ......... H01L 43/10; H01L 43/02; H01L 43/08; H01L 27/222; G11C 11/16; G11C 11/161
See application file for complete search history.

(56) References Cited

U.S. PATENT DOCUMENTS

| | | | | |
|---|---|---|---|---|
| 6,723,450 B2 * | 4/2004 | Do | .......................... | G11B 5/66 428/828 |
| 7,282,277 B2 * | 10/2007 | Munteanu | .............. | G11B 5/656 428/829 |

(Continued)

OTHER PUBLICATIONS

Search Report as issued in European Patent Application No. 17306063.3, dated Feb. 13, 2018.

*Primary Examiner* — Ida M Soward
(74) *Attorney, Agent, or Firm* — Pillsbury Winthrop Shaw Pittman LLP

(57) ABSTRACT

A synthetic antiferromagnetic layer includes a first ferromagnetic layer containing an amorphizing element, the first ferromagnetic layer having a first structural symmetry; a second ferromagnetic layer having a second structural symmetry; wherein the first and the second ferromagnetic layers are antiferromagnetically coupled by a trifunctional non-magnetic multi-layered structure, the antiferromagnetic coupling being an Ruderman-Kittel-Kasuya-Yosida (RKKY) coupling, the non-magnetic multi-layered structure including at least two non-magnetic layers, the non-magnetic multilayered structure being at least partially nano-crystal- (Continued)

line or amorphous in order to ensure a structural transition between the first ferromagnetic layer having the first structural symmetry and the second ferromagnetic layer having the second structural symmetry, the non-magnetic multilayered structure being adapted to absorb at least part of the amorphizing element out of the first ferromagnetic layer in contact with the non-magnetic multi-layered structure.

14 Claims, 9 Drawing Sheets

(51) Int. Cl.
    *H01L 43/08*     (2006.01)
    *H01L 27/22*     (2006.01)
    *G11C 11/16*     (2006.01)

(52) U.S. Cl.
    CPC ............ *H01L 27/222* (2013.01); *H01L 43/02* (2013.01); *H01L 43/08* (2013.01)

(56) References Cited

U.S. PATENT DOCUMENTS

| | | | |
|---|---|---|---|
| 8,048,492 B2 * | 11/2011 | Fukuzawa | B82Y 25/00 427/532 |
| 8,184,408 B2 * | 5/2012 | Murakami | B82Y 10/00 257/421 |
| 8,498,149 B2 * | 7/2013 | Ranjan | B82Y 25/00 365/148 |
| 8,649,127 B2 * | 2/2014 | Fuji | B82Y 10/00 360/322 |
| 8,796,796 B2 * | 8/2014 | Watts | H01L 29/82 257/421 |
| 9,070,381 B1 * | 6/2015 | Yang | G11B 5/3906 |
| 9,230,575 B2 * | 1/2016 | Singleton | G11B 5/3912 |
| 9,337,415 B1 | 5/2016 | Oh et al. | |
| 9,590,010 B1 | 3/2017 | Gottwald et al. | |
| 9,646,635 B2 * | 5/2017 | Singleton | G01R 33/09 |
| 9,704,517 B2 * | 7/2017 | Singleton | G11B 5/3912 |
| 9,922,673 B2 * | 3/2018 | Campiglio | G01R 33/093 |
| 10,074,387 B1 * | 9/2018 | Xiao | G11B 5/3912 |
| 2005/0128651 A1 * | 6/2005 | Yi | B82Y 10/00 360/324.1 |
| 2014/0175574 A1 | 6/2014 | Watts et al. | |
| 2014/0268428 A1 * | 9/2014 | Dimitrov | G11B 5/3912 360/313 |
| 2016/0104544 A1 * | 4/2016 | Schafer | G11C 7/04 374/141 |
| 2016/0300999 A1 * | 10/2016 | Yi | H01L 43/10 |
| 2016/0365104 A1 * | 12/2016 | Ge | G11B 5/3912 |
| 2018/0180686 A1 * | 6/2018 | Ferreira | G01R 33/098 |
| 2018/0219152 A1 * | 8/2018 | Apalkov | H01L 43/08 |
| 2019/0006583 A1 * | 1/2019 | Tahmasebi | H01L 43/10 |

* cited by examiner

SYNTHETIC ANTIFERROMAGNETIC LAYER, MAGNETIC TUNNEL JUNCTION AND SPINTRONIC DEVICE USING SAID SYNTHETIC ANTIFERROMAGNETIC LAYER

CROSS-REFERENCE TO RELATED APPLICATIONS

This application claims priority to European Application No. 17306063.3 filed on Aug. 10, 2017, the content of which is incorporated herein by reference in its entirety.

FIELD

The invention is associated with the design of a novel, thin and thermally robust synthetic antiferromagnetic reference layer for spintronic devices, this layer can be made thinner than conventional synthetic antiferromagnetic layer. It can in particular be used in spin transfer torque magnetic random access memory (STT-MRAM), magnetic logic, spin-torque oscillator, memristor and magnetic sensor applications.

BACKGROUND

Magnetic tunnel junctions MTJs are key elements in spintronic devices. In STT-MRAM and logic circuits, MTJs are used as storage elements. For sensor applications, their magnetoresistance is used to convert changes in magnetic field into changes in electrical resistance. In spin transfer oscillators, their magnetoresistance combined with spin transfer torque is used to generate RF voltages across the MTJ pillar. MTJs comprise essentially two magnetic electrode layers separated by a thin tunnel barrier that most often is made of MgO. The magnetization of one of the magnetic electrodes is fixed by a synthetic antiferromagnetic layer SAF while the magnetization of the other electrode (called free layer or storage layer SL) can be switched to parallel or antiparallel alignment with that of the fixed layer. The fixed layer is also called a polarizer layer PL. A typical structure of a MTJ is showed in FIG. 1. The switching of the SL magnetization is induced by a current of sufficiently large amplitude flowing vertically through the stack upwards or downwards by using spin transfer torque.

The magnetic state of the memory element is read out by using the tunnel magnetoresistance TMR of the MTJ. Parallel magnetic configuration usually yields a lower resistance than the antiparallel configuration. MgO based MTJs exhibit a large TMR amplitude exceeding 200% with practical perpendicular MTJ stacks at room temperature and even up to 600% in some cases. This large TMR is obtained thanks to the bcc (body cubic centered) coherent crystalline nature of both the CoFe alloy based magnetic electrodes and of the MgO barrier. This crystalline coherence yields a spin-filtering effect associated with the symmetry of the electron wave-functions. This additional spin-filtering mechanism is responsible for the large TMR of these junctions.

A stack appropriate for magnetic random access memories (MRAM) applications satisfies a number of requirements both from magnetic and transport points of view. Concerning the magnetic properties, it exhibits a strong pinning of the polarizer layer PL to make sure that its magnetization does not switch during operation as well as a high thermal stability of the storage layer SL magnetization to ensure the required memory retention but still having the ability to switch the storage layer magnetization with minimum current density. Concerning the electrical properties, the MTJ stack has a TMR amplitude as large as possible, preferably above 200% and even higher for high density memory applications (several Gbits) as well as resistance× area RA product adjusted so as to approximately match the resistance of the selection transistor in passing mode (i.e. RA product in the range of 3 to 10 $\Omega \cdot \mu m^2$ but decreasing as the memory dot size decreases).

The process of deposition and annealing of MgO based magnetic tunnel junctions MTJ is well known by the man skilled in the art. An example of such a magnetic tunnel junction MTJ is shown in FIG. 1.

In this case the layers have a magnetization perpendicular to their plane. The storage layer SL consists here of 1.5 nm CoFeB/0.3 nm Ta/1.4 nmCoFeB. The storage layer SL is sandwiched between two MgO tunnel barriers to increase the perpendicular anisotropy of the storage layer arising from the CoFeB/MgO interfaces. The cap layer is here non-magnetic.

Amorphous CoFeB alloys are used as electrode material in contact with the MgO barrier. The stacks are subsequently annealed at elevated temperature (typically in the range 300-400° C.) to improve the crystallization of the MgO barrier into (100) bcc structure and induce the crystallization of the CoFeB alloy from the MgO interface towards the bulk of the layers. The CoFeB layers crystallize in a bcc structure which matches the (100) bcc structure of MgO. This results in a nice crystalline coherence between the CoFe based magnetic electrodes and the MgO barrier which is required to get a large TMR amplitude. In this bcc structure, the growth planes (parallel to the CoFeB/MgO interfaces) have a 4-fold symmetry. During recrystallization process, the B has to be expelled out of the CoFeB layer. This is achieved by introducing in the stack a B absorbing layer in direct contact with the CoFeB layer at the interface opposite to the CoFeB/MgO interface. The most widely used B absorbing layer is made of Ta but Mo, W or Hf have also been proved to work. Depending on the application, magnetic tunnel junctions MTJs can be developed with in-plane or out-of-plane magnetization. For the main application which is STT-MRAM, mostly out-of-plane magnetized MTJs are used because they offer better trade-off between thermal stability of the storage layer SL and write current than their in-plane counterpart. In these out-of-plane magnetized MTJs (also called perpendicular MTJs, noted pMTJs), the polarizer layer PL have a strong perpendicular anisotropy so that the polarizer layer keeps a stable magnetization during all the memory life time. For that, the polarizer layer PL is usually coupled through the thin B absorbing layer to another layer called pinning layer PI having strong perpendicular anisotropy (typically a (Co/X) based multilayer), where X represents Pt, Pd or Ni metals. Then, to reduce the stray field exerted by this pinning layer PI and the polarizer layer PL on the storage layer, a synthetic antiferromagnetic reference layer SAF with perpendicular anisotropy pSAF is usually used in the stack. The conventional pSAF layer in perpendicular tunnel junction stacks pMTJs comprises two sets of Co/X multilayers ML1, ML2 anti-ferromagnetically coupled through a thin Ru layer called an antiferromagnetic coupling layer (AFC) via Ruderman-Kittel-Kasuya-Yosida (RKKY) interactions. Ru layer thickness is typically between 0.4 and 0.8nm to provide the antiferromagnetic coupling. These Co/X multilayers generally have a cubic face centered fcc structure and grow by sputtering in the (111) direction. As a result, the growth planes have a 3-fold symmetry. Due to the difference of symmetry order of the CoFeB/MgO/CoFeB part of the MTJ stack and of the pinning layer (4-fold mversus 3-fold symmetry respectively), a symmetry breaking layer SBL is required to allow the structural transition from one to the other structure. Ta which is used as B absorbing layer also realizes this function of structural transition layer thanks to its nano-crystallinity. The configuration of conventional pSAF in conventional pMTJs given in FIG. 1 is therefore: buffer layer/[Co/X]m/Co/Ru/[Co/X]n/Co/symmetry breaking layer/CoFeB/tunnel barrier,
where X represents Pt, Pd or Ni metals. The layers below Ru, ([Co/X]m/Co) are dubbed here as the harder layer HL and above (/[Co/X]n/Co/structural symmetry breaking layer /CoFeB) constitute the so-called softer layer. As mentioned previously, these hard layer HL and softer layer are antiferromagnetically coupled by Ru layer via RKKY interaction.

We mention that in in-plane magnetized MTJs, the same problem of structural transition between fcc and bcc parts of the stack exists. Indeed, for in-plane magnetized MTJs, the pinning of the in-plane synthetic antiferrromagnetic reference layer SAF is usually achieved by the phenomenon of exchange bias obtained by coupling one of the ferromagnetic layer of the SAF to an antiferromagnetic layer (most often made of Ir20Mn80, about 5 to 8 nm thick) which has a fcc structure. Therefore, a structural symmetry breaking layer is introduced between the pinned part of the stack and the polarizer layer to allow the structural transition from fcc to bcc. Synthetic antiferromagnetic reference layers SAF for in-plane magnetized MTJs have commonly composition of the form:
buffer layer/IrMn 7 nm/CoFe 2.5 nm/Ru 0.8 nm/CoFe 1 nm/structural symmetry breaking layer 0.3 nm/CoFeB 1.8 nm/tunnel barrier, Using such thick conventional in-plane or out-of-plane magnetized SAF layer poses difficulty during etching of MTJs for spintronic devices fabrication. This difficulty arises due to the generation of non-volatile etch product in the etching chamber which are redeposited at the side wall of the magnetic cell and particularly aside of the tunnel barrier, providing shunting paths for current. The thicker the conventional SAF, the larger the risks of short-circuit due to redeposition of non-volatile etch products. This affects the yield, reduces the magnetoresistance amplitude, and increases the dot to dot variability. In the state of the art, in the case of out-of-plane magnetized MTJ, a thin pSAF structure was proposed and demonstrated to partially improve this problem by using a pSAF layer configuration consisting of buffer layer/[Co/X]m/Co/Ru/Co/texture breaking layer/CoFeB/MgO (see for example the patent U.S. Pat. No. 8,860,156 B2 by R. Beach et al.; "Scalable and thermally robust perpendicular magnetic tunnel junctions for STT-MRAM" by M. Gottwald et al., published in Applied Physics Letters, vol. 106, 2015).

The difference with the previously described conventional pSAF is that the layer above the Ru spacer does not contain a Co/X multilayer. It is directly the antiferromagnetic coupling with the multilayer below the Ru spacer plus the interfacial perpendicular anisotropy at the CoFeB/MgO interface which pulls the magnetization of the soft layer and polarizer layer (here Co/Ta/CoFeB) out-of-plane. However, this pSAF layer does not show sharp magnetic reversal with high squareness after annealing at 400° C. temperature. This is most likely due to interdiffusion of symmetry breaking material (for instance Ta) into the CoFeB layers. It is known that Ta indeed easily diffuses into CoFeB alloys above 300° C. preferentially along the grain boundaries during the annealing process. In the cited references, Ta and an alloy based on Fe, Co and Ta were used as symmetry breaking layer to ensure the transition from fcc (111) to bcc (001) CoFeB polarizer layer. The patent U.S. Pat. No. 8,860,156 B2 does not report anything about the annealing stability of the pSAF layers. Moreover, in the pSAF layer configuration of the cited references, the RKKY coupling layer Ru and symmetry breaking layer were separated by a Co dusting layer. To balance the offset field originated from this additional Co dusting layer on the storage layer, the magnetic moment and therefore the number of bilayers of the hard multilayer HL must also be increased. Therefore, it partially limits the thickness reduction of the pSAF.

SUMMARY

A first aspect of the invention is a synthetic antiferromagnetic reference layer comprising a non-magnetic tri-functional layer. A second aspect of the invention is a magnetic tunnel junction MTJ comprising the synthetic antiferromagnetic reference layer. A third aspect of the invention is a spintronic device comprising the synthetic antiferromagnetic layer.

Aspects of the invention aim to at least partially solve the above drawbacks with a new trifunctional non-magnetic multilayer structure TriAF used to achieve three functions: i) to antiferromagnetically couple two ferromagnetic layers in a SAF, ii) to insure a structural symmetry transition within the SAF stack and iii) to absorb the B out of the ferromagnetic layer adjacent to the tunnel barrier. The benefit of this TriAF compared to the state of the art SAF is to provide an ultrathin antiferromagnetic synthetic layer SAF. The SAF according to an embodiment of the invention is thinner than the standard SAF used in magnetic tunnel junction MTJ and greatly reduces the issues due to the redeposition of the etch products following the etching process.

The magnetic tunnel junctions MTJs obtained thanks to the synthetic antiferromagnetic layer SAF according to the invention show then an increased production yield, an enhanced magnetoresistance amplitude, and a reduced dot to dot variability.

To this effect, an aspect of the invention is directed to a synthetic antiferromagnetic layer SAF comprising:
 a first ferromagnetic layer containing an amorphizing element, the first ferromagnetic layer having a first structural symmetry;
 a second ferromagnetic layer having a second structural symmetry;
wherein the first and the second ferromagnetic layers are antiferromagnetically coupled by a non-magnetic multi-layered structure TriAF, the antiferromagnetic coupling being an RKKY coupling. The non-magnetic multi-layered structure comprises at least two non-magnetic layers, the non-magnetic multilayered structure TriAF being at least partially nano-crystalline or amorphous in order to allow a structural transition between the first ferromagnetic layer having a first structural symmetry and the second ferromagnetic layer having a second structural symmetry. The non-magnetic multi-layered structure is adapted to absorb at least part of the amorphizing element out of the first ferromagnetic layer in contact with the non-magnetic multi-layered structure.

A synthetic antiferromagnetic layer SAF according to an embodiment of the invention can have an in-plane magnetization or an out of plane magnetization. The latter is also known as a perpendicular synthetic antiferromagnetic layer or pSAF.

An amorphizing element shall be understood according to the invention as a chemical element adapted to transform a crystalline structure into an at least partially or totally amorphous structure. The amorphizing element may be for instance Boron B or zirconium Zr.

The non-magnetic structure TriAF is named a trifunctional layer because it has three functions. First, in case where the amorphizing element is Boron, it acts as a Boron scavenger attracting the boron out of the first ferromagnetic layer in contact with the MgO tunnel barrier TB upon annealing of the stack. The non-magnetic multi-layered structure TriAF can also be designated indifferently by the terms non-magnetic coupling multilayer TriAF or non-magnetic RKKY coupling multilayer TriAF.

In fact, for instance in a MgO based magnetic tunnel junction MTJ, during the annealing of the stack, the bcc (100) crystallinity of the MgO tunnel barrier is improved and induces the crystallization of the CoFeB PL layer from the interface towards the bulk of the structure. Simultaneously Boron is expelled out from the CoFeB PL layer to the TriAF layer which facilitates bcc (100) crystallization of CoFeB PL. The TriAF layer is adapted to absorb the boron expelled out of the PL layer upon annealing.

Second, it serves to ensure a crystalline transition between 3-fold symmetry fcc structure and 4-fold symmetry bcc structure.

For example, in a MgO based magnetic tunnel junction MTJ the polarized layer PL has a 4-fold symmetry bcc structure while the hard layer HL has a 3-fold symmetry fcc structure.

Third, it also provides strong RKKY antiferromagnetic coupling between the first and the second ferromagnetic layers, PL and HL. The antiferromagnetically coupled ferromagnetic layers can then be used in order to obtain a synthetic antiferromagnetic layer SAF.

This trifunctional coupling layer TriAF suppresses the need for an extra ferromagnetic layer and symmetry breaking layer SBL between the antiferromagnetic coupling layer (Ru for instance) and the CoFeB reference layer.

Beneficially, the synthetic antiferromagnetic layer SAF comprising the trifunctional non-magnetic multi-layered structure TriAF is very thin. In fact, the proposed synthetic antiferromagnetic layer SAF removes two distinct layers in prior art magnetic stacks: the magnetic layer between Ru RKKY coupling layer and PL layer (it can be Co dusting layer or Co/X multilayers) and the symmetry breaking layer SBL which serves also as Boron absorber layer. As a consequence, the obtained synthetic antiferromagnetic SAF layer is thinner than the synthetic antiferromagnetic layers of the prior art. The resulting magnetic tunnel junction MTJ has a reduced thickness which accounts for a higher production yield, reduced dot-to-dot variability and enhanced tunnel magnetoresistance TMR amplitude.

As a result, the thickness of the SAF stack can be reduced by 1.3 to 1.6 nm compared to the thickness of state of the art SAF. The materials used in this trifunctional antiferromagnetic coupling layer TriAF also minimize the risks of interdiffusion up to 400° C. annealing temperature thus allowing to reach higher TMR amplitude thanks to higher possible annealing temperatures. In addition, thanks to its good thermal stability, the proposed SAF layer allows back-end-of-line process fabrication of spintronic devices.

Moreover, using reduced magnetic thicknesses in the SAF minimizes the dipolar field exerted by the SAF layer on the storage layer and thanks to its reduced thickness, it facilitates the etching process by producing less non-volatile etch product. Therefore, this trifunctional coupling layer TriAF allowing to reduce the thickness of the pinned layer is particularly important for MTJ based MRAM, including STT-M RAM, spin-orbit torque MRAM (SOT-MRAM), voltage controlled MRAM, for which the patterning of very small MTJs (sub-20 nm) is required to reach high memory densities (Gbit range).

It can also be used in all spintronic devices in which a SAF layer have to be formed associated with a structural transition within the SAF, in particular in magnetic-field sensors based on MTJ and in spin transfer torque oscillators, spin orbit torque oscillators or spin-diodes.

Besides the main characteristics, which have been outlined in the foregoing paragraphs, the synthetic antiferromagnetic layer SAF according to one or more embodiments of the invention may include one or more additional characteristics from those listed in the following, either individually or in any technical possible combination thereof:

- the trifunctional non-magnetic multi-layered structure TriAF comprises a first C and a second T non-magnetic layer, the first non-magnetic layer C comprising one of the following elements Ru, Re, Rh, Ir, Os or an alloy thereof and/or the second T non-magnetic layer comprising one of the following elements W, Mo, Nb, Cu, Ta, V, Cr or an alloy thereof;
- the thickness of the first C non-magnetic layer is lower than 2 nm and beneficially comprised between 0.2 nm and 0.9 nm;
- the thickness of the second T non-magnetic layer is lower than 1 nm and beneficially comprised between 0.1 nm and 0.6 nm;
- the non-magnetic multi-layered structure TriAF comprises n bilayers, each bilayer comprising a first C and a second T non-magnetic layers;
- the non-magnetic multi-layered structure TriAF comprises n bilayers, each bilayer comprising a first C and a second T non-magnetic layer, with T on top;
- the non-magnetic multi-layered structure TriAF comprises n bi layers, each bilayer comprising a first C and a second T non-magnetic layer, with T at the bottom, if the boron rich electrode is below the TriAF layer.

A second aspect of the present invention is a magnetic tunnel junction MTJ comprising the synthetic antiferromagnetic layer SAF according to an embodiment of the invention, a first tunnel barrier TB layer and a storage layer SL and/or a second tunnel barrier layer such as a MgO layer added in contact with the storage layer SL on its interface opposite to the first tunnel barrier. The first and second tunnel barrier layer TB may be made of MgO. But other materials such as for instance $MgAl_2O_4$ may also be used for the first and second tunnel barrier.

Beneficially, thanks to the use of the synthetic antiferromagnetic layer SAF according to the invention the resulting magnetic tunnel junction MTJ has a reduced thickness which is useful in reducing the redeposition of impurities following the etching process, increasing the production yield, enhancing the tunnel magnetoresistance and reducing the dot to dot variability.

Beneficially, when the storage layer is placed below the MgO tunnel barrier, the magnetic tunnel junction MTJ is particularly adapted for SOT-MRAM since the free layer has to be in contact with an horizontal conducting line having high spin orbit constant.

The magnetic tunnel junction MTJ according to an embodiment of the invention may include one or more additional characteristics from those listed in the following, either individually or in any technical possible combination thereof:

The storage layer is a composite storage layer CSL, the composite storage layer comprising a stack formed by at least a first ferromagnetic layer FM, a non-magnetic layer or multilayer NM and a second ferromagnetic layer FM, the first and second ferromagnetic layers comprising at least one of the following alloys CoFeB, FeB, CoFe and the non-magnetic layer or multilayer being adapted to absorb the amorphizing element and comprising at least one of the following elements Ta, W, Mo, Ru or an alloy thereof;

The composite storage layer CSL comprises a stack formed by a ferromagnetic FM layer, a non-magnetic layer NM and a ferromagnetic layer FM;

The magnetic tunnel junction MTJ comprises an additional magnetic layer APL added in contact with the second tunnel barrier layer and/or an additional synthetic antiferromagnetic layer SAF or pSAF in contact with the second tunnel barrier layer; the additional magnetic layer APL is acting as a spin polarizing layer; the additional synthetic antiferromagnetic layer comprises an additional trifunctional non-magnetic multi-layered structure TriAF; the additional magnetic polarizing layer APL is antiferromagnetically coupled to a second hard layer HL across the additional TriAF layer, forming a second SAF or top SAF; using such an additional trifunctional non-magnetic multi-layered TriAF allows beneficially reducing the total thickness of the stack; however, conventional synthetic antiferromagnetic layer may also be used in the frame of the invention without departing from the scope of the invention;

The magnetic tunnel junction MTJ has a non-magnetic electrode on the side of the second MgO layer opposite to the side in contact with the storage layer;

The storage layer SL is formed by a synthetic antiferromagnetic layer SAF according to an embodiment of the invention;

The magnetic tunnel junction MTJ have in-plane anisotropy;

The magnetic tunnel junction MTJ have out-of-plane anisotropy;

The magnetic tunnel junction comprises a Seed layer;

The magnetic tunnel junction comprises a Substrate layer Sub.

Another aspect of the invention is a spintronic device including a synthetic antiferromagnetic SAF layer comprising a trifunctional layer TriAF according to an embodiment of the invention.

Such a device can be for example a Spin Transfer Torque Magnetic Random Access Memory STT-MRAM, a Spin Orbit Torque Magnetic Random Access Memory SOT-MRAM, a Spin transfer torque oscillator, a spin orbit torque oscillator, a spin-diode or a magnetoresistive sensor.

BRIEF DESCRIPTION OF THE FIGURES

Other characteristics and benefits of the invention will be evident from the description thereof that is provided in the following, purely for non-limiting, exemplary purposes, with reference to the accompanying drawing, in which.

DETAILED DESCRIPTION

Figure 1:
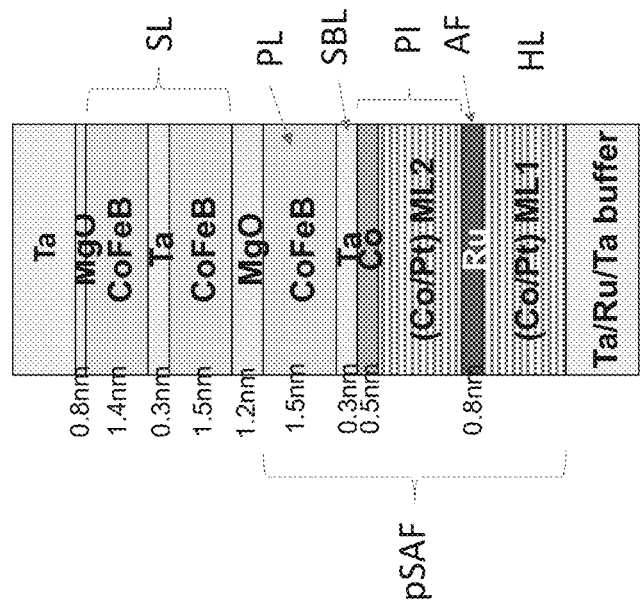
FIG. 1 shows a schematic representation of a typical MTJ stack used in the prior art.
Figure 2:
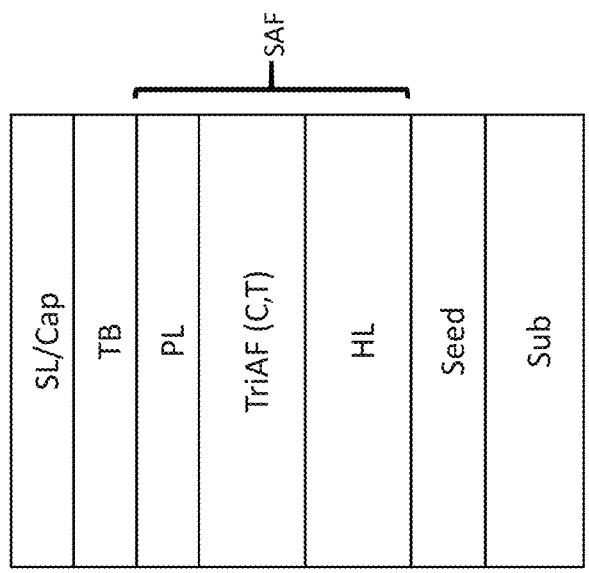
FIG. 2 shows a schematic drawing of the layer configuration of a perpendicular synthetic anti-ferromagnetic SAF layer or pSAF using a trifunctional antiferromagnetic coupling TriAF layer according to an embodiment of the invention.

FIG. 2 shows a first example of a synthetic antiferromagnetic SAF layer comprising a trifunctional non-magnetic multi-layer structure TriAF according to an embodiment of the present invention.

FIG. 2 shows that the synthetic antiferromagnetic layer SAF according to an embodiment of the invention comprises:
- a first ferromagnetic layer PL having a first crystalline structure after annealing;
- a non-magnetic multilayer structure TriAF;
- a second ferromagnetic layer HL having a second crystalline structure.

The magnetic stack shown in FIG. 2 comprises the following layers (from bottom to top): a substrate layer SUB, a seed layer on top of the SUB layer, the synthetic antiferromagnetic layer SAF according to an embodiment of the invention, a tunnel barrier TB on the top of the SAF layer, a storage layer SL and a cap layer above the storage layer. This forms a magnetic tunnel junction MTJ.

In the case where the layers constituting the synthetic antiferromagnetic layer SAF are magnetized out-of-plane, the structure is called a perpendicular synthetic antiferromagnet pSAF.

The first ferromagnetic layer PL can act as a polarizer or reference layer. In the example of FIG. 2 the polarizing layer PL can be a CoFeB alloy layer or a CoFe based alloy layer or an Heusler alloy layer or a combination of such layers.

In the case of out-of-plane magnetized MTJs, the hard layer HL comprises n bilayers of A/X nano-laminates which have intrinsic perpendicular magnetic anisotropy PMA originated from A/X interfaces via electron hybridization effect or interfacial strain. The material for A can be made of Co, Fe, CoFe, CoFeB or an alloy thereof, and X is Pt, Au, Ir, Pd, Ni, NiCo, NiFe or NiFeCo based alloys. Similar PMA can be obtained if A and X are interchanged to form X/A nano-laminates.

Still in the case of out-of-plane magnetized MTJs, the hard layer HL may also be a material exhibiting bulk PMA, for example $L1_0$ ordered alloy of Fe—Pt, Fe—Pd and Co—Pt; $L1_1$ ordered alloy CoPt, CoPd, Co—Ni—Pt. It may also be an alloy of rare earth-transition metals in the form of RE-TM where RE stands for Tb, Dy, Er, Gd or an alloy thereof, and TM stands for Fe, Co or an alloy thereof. It can also be a Heusler alloy with perpendicular anisotropy such as Mn2.7Co0.3Ga.

In the case of in-plane magnetized MTJs, as well-known by the man skilled in the art, the hard layer HL is, for example, an exchange biased layer i.e. a ferromagnetic layer essentially made of a CoFe alloy 1.5 to 3 nm thick which is exchange coupled to an antiferromagnetic layer most often made of IrMn typically between 5 nm and 8 nm thick or PtMn typically 10 nm to 20 nm thick.

These hard layers HL are actually similar to those used in the prior art.

The trifunctional coupling layer TriAF of the synthetic antiferromagnetic layer SAF according to an embodiment of the invention ensures three functions: the first is to provide antiferromagnetic coupling between the hard layer HL and the reference layer PL. The second function is to ensure a structural transition between two layers of different structural symmetry for instance here the fcc structure of the hard layer HL and the bcc structure of the reference or polarizer layer PL. The third function is absorption of boron from CoFeB polarizer layer PL upon annealing.

The HL and the polarizer layer PL are antiferromagnetically coupled by the trifunctional anti-ferromagnetic TriAF coupling layer. According to an embodiment the TriAF coupling layer consists of a C/T bilayer where C is one of Ru, Re, Rh, Ir, Cu and Os or an alloy thereof. The thickness of this C layer is adjusted in the range 0.2 nm-0.9 nm together with that of the T layer to provide a strong RKKY interaction between HL and PL through the C/T composite layer. T can be one of W, Mo, Nb, V, Ta, Cr or an alloy thereof, which functions as a symmetry breaking layer allowing the structural transition from the HL layer.

This is particularly useful because the hard layer HL and the polarizer layer have usually different crystal structures. For example, the hard layer HL can have a fcc crystal structure as for Co/Pt type multilayers or exchange biased IrMn/CoFe bilayers, or tetragonal as with FePt $L1_0$. The polarizer layer PL can have a bcc (001) crystal structure like CoFeB.

The T layer can also act as inter-diffusion barrier between the C layer and the PL layer and/or as a partial B getter layer. The thickness of the T layer is also adjusted in the range (0.1-0.6 nm) together with that of the C layer to provide strong antiferromagnetic coupling between HL and PL through the C/T composite layer. The TriAF coupling layer can be a multilayer formed with (C/T)n configuration with T on top. This means that the TriAF layer is formed by n bilayers of C/T bilayers. Since the C/T bilayers play the three functions of coupling, symmetry breaking and B absorption, this stack of layers acts as a trifunctional anti-ferromagnetic coupling layer (TriAF).

The tunnel barrier can be one of MgO, AlOx, TaOx, TiO2, HfOx, ZrOx, GaOx, SrTiO3 or other metal oxide on top of pSAF layer which generate interface perpendicular magnetic anisotropy with PL and SL and provides large TMR amplitude.

Figure 3:
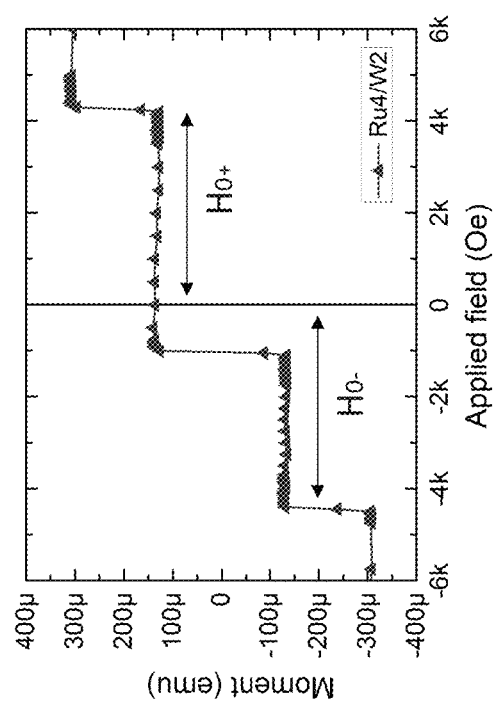
FIG. 3 shows the magnetization M of a SAF according to the invention as a function of the applied field H. Only one branch of the hysteresis loop is shown here corresponding to the field decreasing from positive to negative saturation.

FIG. 3 shows the variation of the magnetization M of a synthetic antiferromagnetic layer SAF as a function of the applied magnetic field H varying from positive saturation to negative saturation. This represents the descending branch of the M-H hysteresis loop. For clarity, the ascending branch is not represented. The ascending branch would be symmetric of the descending one with respect to the origin of the graph. The y axis represents the measured magnetization expressed in electromagnetic unit and the x axis represents the applied magnetic field in Oe.

The SAF/MgO/cap measured sample has the composition Pt/(Co/Pt)3/Co/Ru 4 Å/W 2 Å/CoFeB 10 Å/MgO/Cap and was annealed at 340° C. The M-H loop was measured by vibrating sample magnetometer VSM. Along this descending branch of hysteresis loop, the field is decreased from the positive saturation to the negative saturation. Three magnetization reversal steps are observed while decreasing the field from positive to negative saturation as described below. All the magnetization reversal steps with the sweeping of magnetic field are sharp with high squareness. This signifies that the SAF layer has perpendicular anisotropy. Coming from high saturation positive field, the first reversal around 4280 Oe is the characteristic field $H_{0+}$ at which the RKKY coupling energy gain associated with bringing the HL and the polarizing 10 Å CoFeB layer PL magnetizations in antiparallel alignment balances the cost in Zeeman energy associated with reversing the PL magnetization in the direction opposite to the applied field. Below this characteristic field, the magnetic moments across the TriAF coupling layers are aligned antiparallel. When the field is reversed and increased negatively, another characteristic field around −1000 Oe corresponds to the simultaneous reversal of both PL and HL magnetization. This characteristic field can be viewed as the coercive field of the net moment formed by the PL and HL antiferromagnetically coupled sandwich. Finally, at $H_{0-}$=−4450 Oe, the Zeeman energy exceeds the RKKY coupling energy so that the two magnetic moments again switch to parallel configuration. Both HL's and PL's moments are then completely saturated along the negative field direction. In macrospin approximation the field $H_{0+}$ and $H_{0-}$ would be expected to be identical in absolute value. However, in reality, they slightly differ (4280 Oe vs 4450 Oe) because the switching process is different in the two transitions.

At 4280 Oe, the switching of the CoFeB layer at 4280 Oe is driven by the RKKY antiferromagnetic coupling against the applied field whereas the switching at −4450 Oe is driven by the applied field against the antiferromagnetic RKKY coupling. A characteristic field Ho can then be defined as $(H_{0+}-H_{0-})/2$ called inter-layer exchange coupling field or RKKY coupling field. It is equal here to 4365 Oe.

The RKKY coupling energy ($J_{RKKY}$) has been calculated by using the equation below, $$J_{RKKY}=H_o M_s t$$

where $M_s$ and t are the saturation magnetization and thickness of the CoFeB PL. The coupling energy depends on the thickness of C and T of the TriAF coupling layer.

Figure 4:
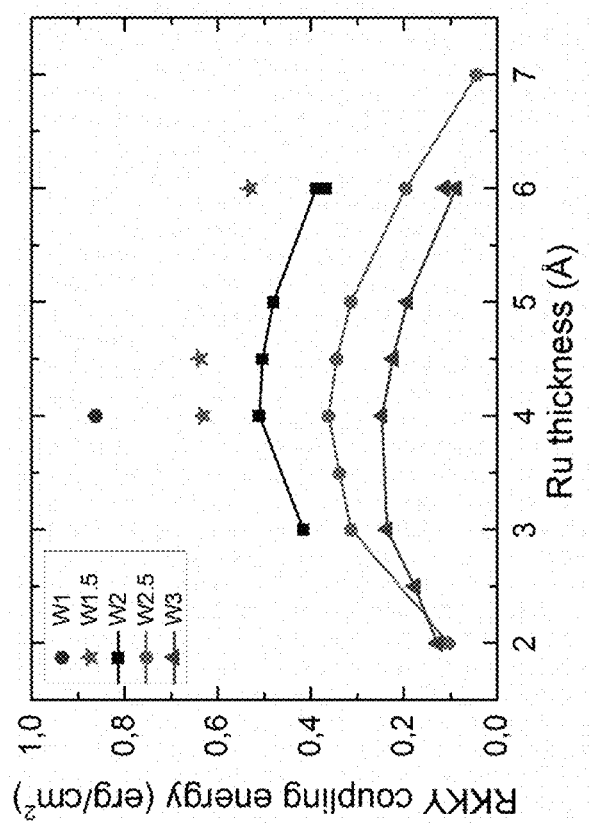
FIG. 4 shows the RKKY coupling energy of the SAF versus thicknesses of the layers constituting the trifunctional antiferromagnetic coupling layer TriAF layer.

FIG. 4 shows the RKKY coupling energy of the SAF versus thicknesses of the different layers of the TriAF layer. The material configuration of the SAF is Pt/(Co/Pt)3/Co/Ru (x)/W (y)/CoFeB 10 Å/MgO, where x and y respectively represent the thicknesses of Ru and W in Angstroms.

In particular, FIG. 4 shows the variation of coupling energy as a function of Ru thickness for different thicknesses of W in Angstroms. The y axis of FIG. 4 represents the RKKY coupling energy expressed in erg/cm$^2$. The x axis represents the thickness of the Ru layer. Each set of points in FIG. 4 represents a different thickness of the W layer.

Depending on the thickness of the TriAF coupling layer, the coupling energy can be tuned over a broad range. For all W thicknesses, the peak in coupling energy appears with Ru thickness in the range of 0.4 to 0.45 nm which is the thickness region for the first peak of the oscillatory curve of RKKY coupling energy.

Figure 5:
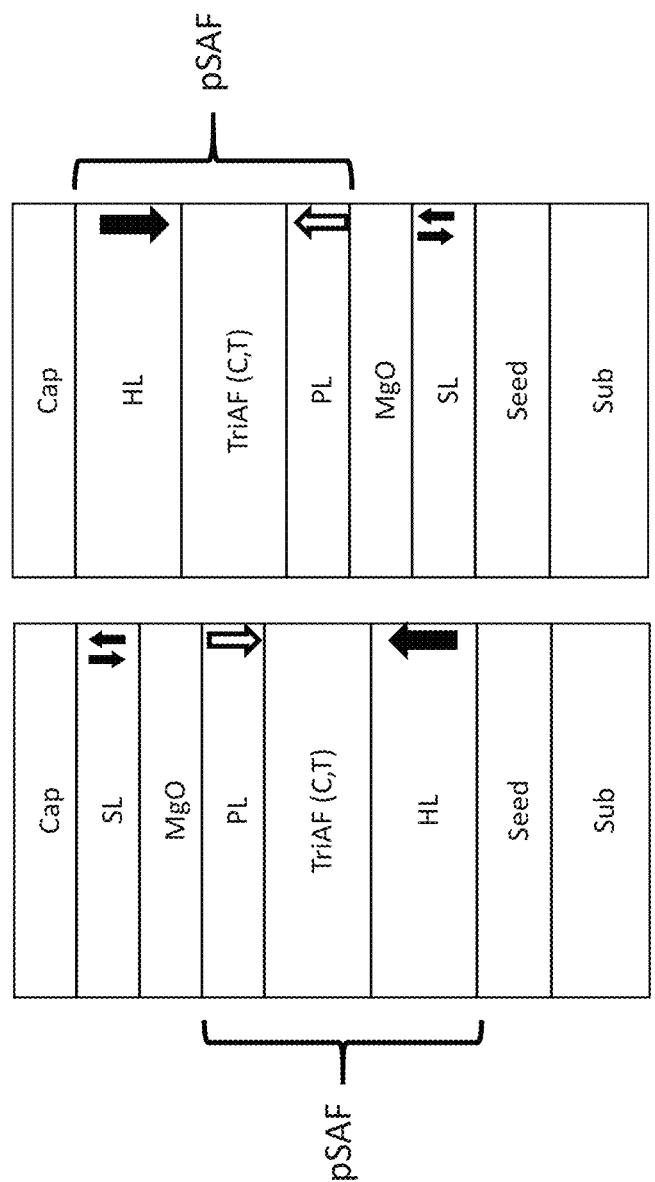
FIGS. 5a and 5b show a schematic drawing of layer configuration of perpendicular magnetic tunnel junction MTJ or pMTJ stack with the proposed synthetic antiferromagnetic SAF layer using a trifunctional coupling layer TriAF according to an embodiment of the invention. Two configurations are shown: (a) the storage layer SL is on top and (b) opposite of first, i.e. SAF layer is on top. The arrows in the diagrams indicates magnetization configuration at zero applied field.

Using the synthetic antiferromagnetic layer SAF with the non-magnetic multilayered structure TriAF, the MTJ stack (either in-plane or out-of-plane magnetized) can be configured as top free or bottom free layer configuration as shown for example in FIGS. 5a and b respectively in the case of out-of-plane magnetized MTJ.

The top free layer configuration of the magnetic tunnel junction MTJ of FIG. 5a comprises the following layers from the bottom to the top of the stack: a substrate layer SUB, a seed layer, a perpendicular antiferromagnetic synthetic layer pSAF according to an embodiment of the invention, a MgO tunnel barrier, a storage layer SL and a cap layer.

The pSAF according to an embodiment of the invention showed in FIG. 5a comprises the following layers from bottom to top: a hard layer HL on the top of the seed layer of the MTJ, a non-magnetic multi-layered structure TriAF on the top of the HL layer and a polarizing layer PL on the top of the TriAF layer, the PL layer being below the MgO tunnel barrier of the MTJ.

In top free layer configuration showed in FIG. 5a, the pSAF layer is below the MgO tunnel barrier whereas the storage layer SL is above it. In the bottom, free layer configuration shown in FIG. 5b, the opposite is true i.e. the free layer SL is below the MgO barrier and the pSAF is above it.

In particular the bottom free layer configuration of the magnetic tunnel junction MTJ of FIG. 5b comprises the following layers from the bottom of the stack to the top of the stack: a substrate layer SUB, a seed layer, a storage layer SL, a MgO tunnel barrier, a perpendicular antiferromagnetic synthetic layer pSAF according to an embodiment of the invention and a cap layer.

The pSAF according to an embodiment of the invention shown in FIG. 5b comprises the following layers from bottom to top: a polarizing layer PL placed on top of the MgO layer of the MTJ, a non-magnetic multi-layered structure TriAF on top of the polarizing layer PL and a hard layer HL on top of the TriAF layer, the HL layer being below the Cap layer of the MTJ.

This configuration with bottom storage layer SL is in particular adapted for SOT-MRAM since the free layer SL has to be in contact with a horizontal conducting line having high spin orbit constant. As known by the man skilled in the art, the MgO tunnel barrier can be prepared by RF deposition of MgO from an MgO target or by natural oxidation of a metallic Mg layer. The free layer SL can be made of CoFeB alloy or be a composite layer consisting of a stack of several layers of different (Co1–xFex)1–yBy compositions (x between 0 and 1 and y between 0 and 0.3). In perpendicular MTJ, as known by the man skilled in the art, provided this layer is thin enough (≤1.6 nm), its magnetization is pulled out-of-plane by the interfacial anisotropy which exists at the interface between the storage layer and the MgO barrier. But other materials exhibiting perpendicular anisotropy and low Gilbert damping (≤0.02) could be used as storage layer or free layer SL in particular among the Heusler alloys.

In FIG. 5a (top free layer configuration), the cap layer Cap is in contact with the storage layer SL. It is a non-magnetic metal which has the ability to absorb the B from the storage layer SL upon annealing. It can be made of Ta but also Mo, W, Ru or other non-magnetic species having the ability to absorb B out of CoFeB upon annealing. Concerning the TriAF layer which is coupling the hard layer HF to the polarizer layer PL, it can be here of the form C/T with the Boron getter layer T above the C layer i.e. in contact with the Boron doped electrode.

In the bottom free layer configuration (FIG. 5b), the cap layer is Cap in contact with the hard layer HL. In this case, since the hard layer HL usually does not contain B, the requirement for this cap layer Cap to be able to absorb B is relieved. The cap layer Cap can still be made of Ta, Ru, W, Mo with other existing possibilities such as Cu, Ti, Au, Pd, Pt, Hf. Concerning the TriAF layer which is coupling the hard layer HL to the polarizer layer PL, it can be here of the form T/C with the Boron getter layer T below the C layer i.e. in contact with the Boron doped electrode.

Similar stacks with bottom free or top free layer can be considered with in-plane magnetized materials. In this case, the HL is an exchange biased layer as previously described and the storage layer SL is chosen with in-plane magnetization. This can be achieved by using also CoFeB layer but with a larger thickness than in the perpendicular anisotropy case so that the easy-plane demagnetizing energy exceeds the interfacial perpendicular MgO/CoFeB anisotropy resulting in an in-plane magnetization of the layer.

Figure 6:
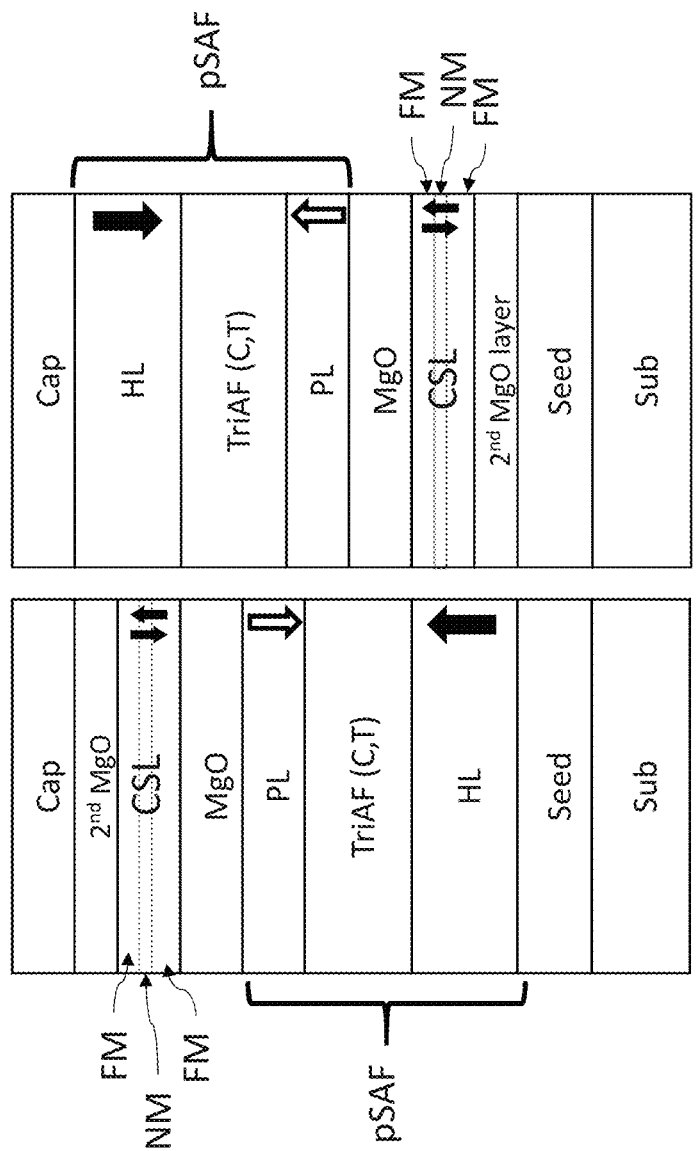
FIGS. 6a and 6b show a second layer configuration of perpendicular magnetic tunnel junction pMTJ stack with a synthetic antiferromagnetic layer SAF according to an embodiment of the invention comprising a trifunctional non-magnetic layered structure TriAF according to the invention.

FIGS. 6 (a) and (b) show another embodiment of the magnetic tunnel junction MTJ according to the invention.

The magnetic tunnel junction MTJ of FIG. 6a comprises the following layers from bottom to top: a substrate layer SUB, a seed layer, a perpendicular synthetic antiferromagnetic layer pSAF according to an embodiment of the invention, a first MgO layer, a com posited storage layer CSL, a second MgO layer and a Cap layer.

The pSAF layer of FIG. 6a comprises from bottom to top: a hard layer HL on top of the Seed layer of the MTJ, a trifunctional non-magnetic multi-layered structure TriAF and a polarizer layer PL below the first MgO layer.

The composite storage layer (CSL) of FIG. 6a comprises two ferromagnetic FM layers ferromagnetically coupled through a thin B absorbing layer or NM layer.

The magnetic tunnel junction of FIG. 6b comprises the following layers from bottom to top: a substrate layer Sub, a seed layer, a second MgO layer, a composite storage layer CSL, a first MgO layer, a perpendicular antiferromagnetic layer pSAF according to an embodiment of the invention and a cap layer.

The pSAF layer of FIG. 6b comprises from bottom to top: a polarizer layer PL above the second MgO layer, a trifunctional non-magnetic multi-layered structure TriAF and a hard layer HL below the cap layer of the MTJ.

A peculiarity of these stacks is that they also comprise a second MgO layer added in contact with the composite storage layer CSL on its interface opposite to the first MgO tunnel barrier. This type of stacks is especially interesting in the case of out-of-plane magnetized MTJs since the second MgO layer allows to further increase the perpendicular anisotropy of the composite storage layer CSL. This increases the thermal stability factor of the composite storage layer CSL and therefore retention of memory devices. This also allows to increase the CSL thickness (typically from 1.3 nm to 3 nm) resulting in an enhanced TMR amplitude. It is also interesting in the case of in-plane magnetized MTJ to reduce the effective demagnetizing field thanks to the doubled interfacial anisotropy at storage layer SL/MgO interfaces which thereby reduces the switching current. In these stacks where the storage layer is sandwiched between two MgO layers, it is then a composite storage layer CSL of composition of the form FM/NM/FM. The ferromagnetic FM layer can be comprised of CoFeB, FeB, CoFe, Fe or combination. NM is generally a non-magnetic layer. The NM layer is intended to absorb the B away from the MgO interfaces. NM can be made of B absorbing materials such as Ta, W, Ru, Mo, or an alloy or MLs thereof. It may also comprise some magnetic elements such as Co and Fe to increase the magnetic coupling across it. In that case, NM may be slightly magnetic. This layer is thick enough to be able to absorb a sufficient amount of B from the adjacent CoFeB layers but is thin enough to still ensure a good magnetic coupling (ferromagnetic or antiferromagnetic depending on its thickness) between the two magnetic layers on both sides of it. Its thickness is typically in the range 0.2 nm to 1 nm. Alternatively, as about the stacks described in FIG. 5, the storage layer can be made of Heusler alloys with perpendicular anisotropy and low damping.

The cap layer Cap above the 2nd MgO layer in the stack of FIG. 6a is non-magnetic. It can be made for instance of Ru, W, Mo, Ta. Similarly, the seed layer below the second MgO layer in FIG. 6b is a non-magnetic one. It can be made of Ta or another material favoring the bcc growth of MgO such as W or Cr.

As an example, a top free perpendicular MTJ stack as described in FIG. 6(a) was deposited. The material configuration for the stack was Pt/(Co/Pt)3/Co/Ru 4 Å/W 2 Å/CoFeB 10 Å/MgO/Composite Storage layer/MgO/Cap. Its hysteresis loop was measured by vibrating sample magnetometry (VSM) after annealing at 400° C.

Figure 7:
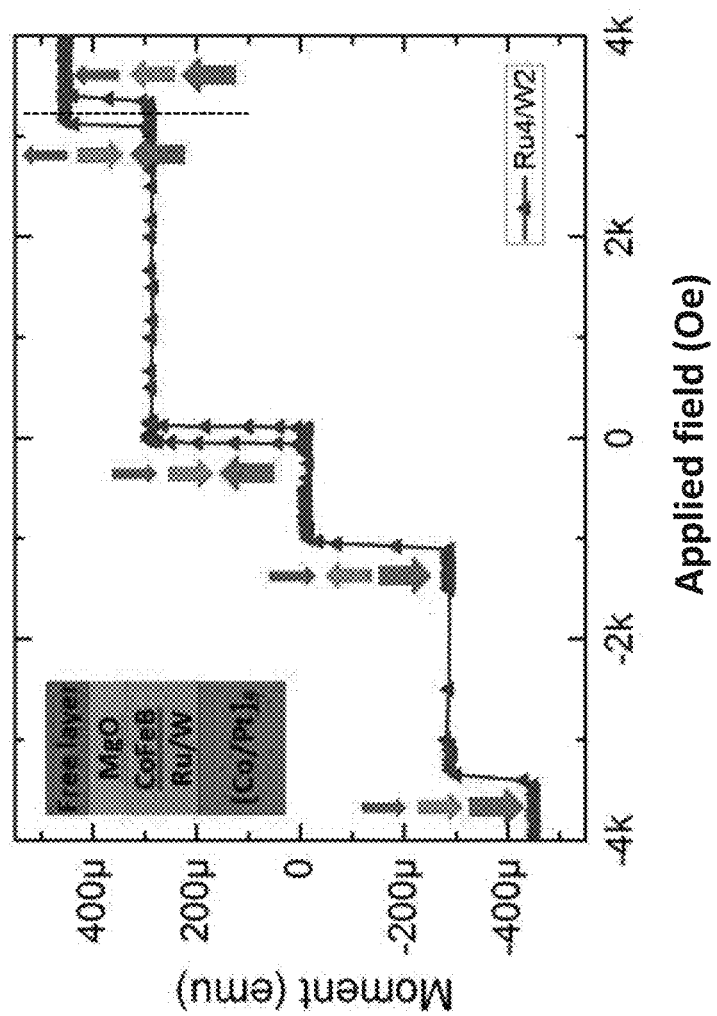
FIG. 7 shows the magnetic hysteresis loop of a perpendicular MTJ stack according to FIG. 2 after annealing at 400° C.

The measured hysteresis loop is shown in FIG. 7. The y axis of FIG. 7 represents the measured magnetization of the stack, expressed in electromagnetic unit. The x axis of FIG. 7 represents the applied magnetic field expressed in Oe. Coming from high positive field, the polarizer layer PL magnetization switches first at 3120 Oe. Then the field is reversed and with a very small negative field (−40 Oe) the free layer magnetization is oriented along the field. With the increase of negative field, there is a characteristic field (−1000 Oe) where magnetization of both PL and HL switch simultaneously (coercive field of the antiferromagnetically coupled sandwich formed by the HL/TriAF/PL). Then finally the PL magnetization switches at −3350 Oe to align with the applied magnetic field. The minor loop of polarized layer across the dotted line at 3240 Oe shows a sharp vertical reversal with coercivity of 130 Oe. This means that at high annealing temperature (400° C.), the perpendicular magnetic anisotropy PMA of PL and its strong RKKY coupling to the HL are preserved by the TriAF coupling layer.

Figure 8:
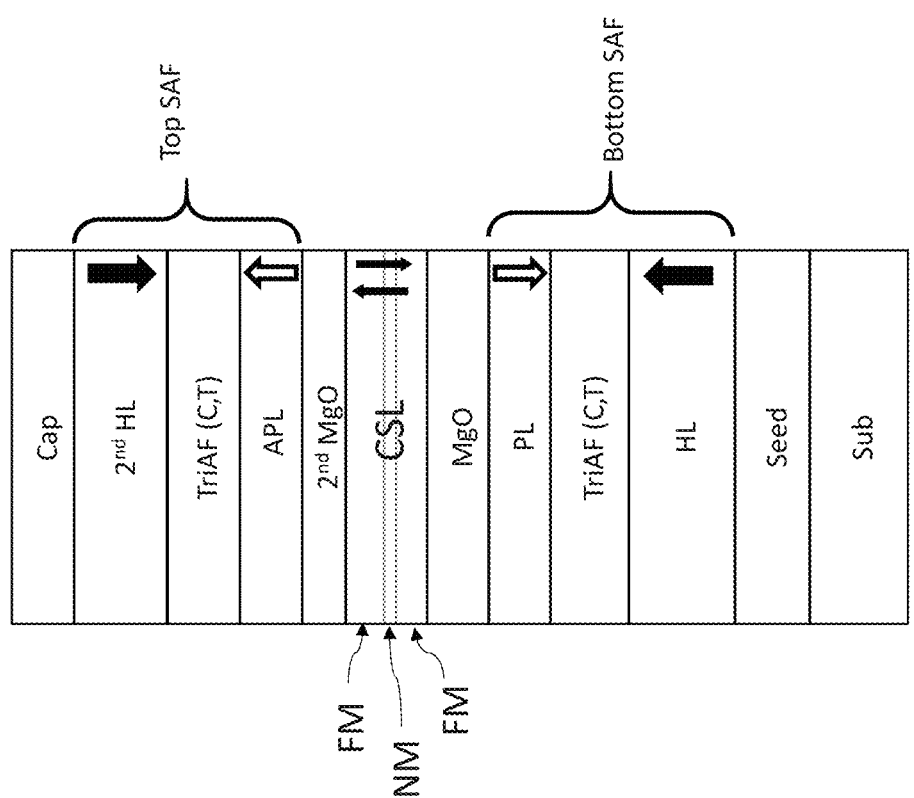
FIG. 8 shows a third layer configuration of a dual perpendicular magnetic tunnel junction DMTJ stack with two synthetic antiferromagnetic layers SAF according to an embodiment of the invention each comprising a non-magnetic layered structure TriAF and the storage layer being a composite storage layer CSL comprising two ferromagnetic layers ferromagneticaly coupled through a thin B absorbing layer.

FIG. 8 shows another embodiment of dual magnetic tunnel junction MTJ stack comprising two proposed thin SAF layers each using a trifunctional coupling layer TriAF. In this case a top perpendicular synthetic antiferromagnetic layer SAF and a bottom perpendicular synthetic antiferromagnetic layer SAF are used.

The stack of FIG. 8 comprises the following layers from bottom to top: a substrate layer Sub, a seed layer, a bottom SAF, a first MgO layer, a composite storage layer CSL, a second MgO layer, a top SAF and a cap layer.

The bottom SAF of FIG. 8 comprises the following layers from bottom to top: a hard layer HL, a trifunctional non-magnetic multi-layered structure TriAF and a polarizing layer PL, the polarizing layer being below the first MgO layer.

The top SAF of FIG. 8 comprises an additional polarizing layer APL, a trifunctional non-magnetic multi-layered structure TriAF and a second hard layer HL, the second hard layer HL being below the cap layer.

In contrast to the stacks described in FIG. 6, the layer above the second MgO barrier is here a magnetic additional polarizing layer APL whereas it is a non-magnetic layer in the embodiment depicted in FIG. 6. The purpose of this additional polarizing layer APL is to further increase the spin transfer efficiency by combining the spin transfer torque acting on the storage layer CSL magnetization originating from the first polarizing layer PL with the spin transfer torque originating from this additional polarizing layer APL. This APL layer can be CoFeB, or other magnetic material with high spin polarization. As described previously, the polarizer layer PL can be antiferromagnetically coupled to a hard layer HL through a TriAF layer to increase its pinning energy. Similarly, the additional polarizing layer APL can be antiferromagnetically coupled to a second hard layer HL through a TriAF layer to increase its pinning energy. The advantages of using such bottom and top SAF layers is to reduce the magnetostatic coupling that they may have between them as well as with the storage layer CSL.

The storage layer CSL is composite and consists of a ferromagnetic/non-magnetic/ferromagnetic or FM/NM/FM sandwich where the magnetizations of the two ferromagnetic layers are ferromagnetically coupled though the non-magnetic spacer (the latter can be made of Ta, W, Mo typically 0.1 to 1 nm thick). When the storage layer is a composite ferromagnetic layer CSL as described here, the magnetization of the CoFeB polarizer layer and of the 2nd polarizer layer is set in antiparallel alignment to obtain the maximum STT efficiency. As well known by the man skilled in the art, setting these magnetizations in antiparallel alignment can be achieved by performing minor hysteresis loops taking advantage of the difference of coercivity of the two polarizer layers.

In this embodiment, as known by the man skilled in the art, the two MgO barriers have different resistance x area RA products since the changes of resistance associated with CSL magnetization switching from the bottom MgO barrier and from the top MgO barrier are opposite in sign. Indeed, when there is parallel magnetic alignment across one barrier, the other is in antiparallel alignment and vice versa. Since these two tunnel barriers can be considered as connected in series, using MgO barriers of different RA allows not to reduce excessively the net tunnel magnetoresistance of the stack. Typically, a difference of RA product by at least a factor 3 is desirable.

Figure 9:
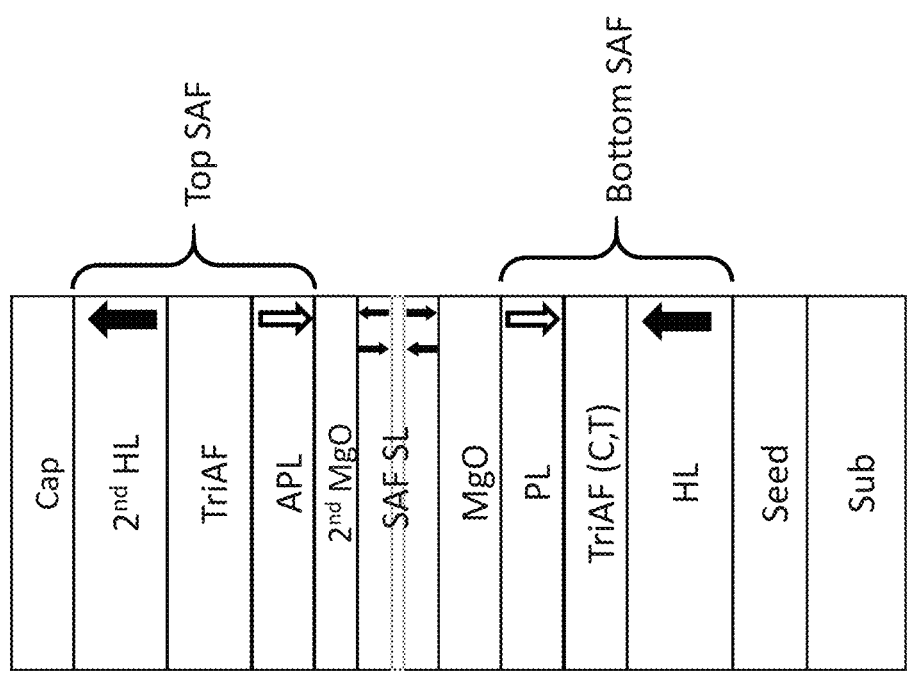
FIG. 9 shows a fourth layer configuration of dual perpendicular magnetic tunnel junction DMTJ stack with two synthetic antiferromagnetic layers SAF according to an embodiment of the invention each comprising a non-magnetic layered structure TriAF according to the invention and the storage layer SAF SL being a SAF comprising two ferromagnetic layers antiferromagneticaly coupled through a thin antiferromagnetic coupling layer.

FIG. 9 shows another embodiment of the magnetic tunnel junction MTJ according to the invention.

The stack of FIG. 9 comprises the following layers from bottom to top: a substrate layer Sub, a seed layer, a bottom synthetic antiferromagnetic layer SAF, a first MgO layer, a synthetic antiferromagnetic storage layer SAF SL, a second MgO layer, a top SAF and a cap layer.

The bottom SAF of FIG. 9 comprises a hard layer HL placed above the seed layer, a trifunctional non-magnetic multilayered structure TriAF, a polarizing layer PL below the first MgO layer.

The top SAF of FIG. 9 comprises from bottom to top an additional polarized layer APL placed above the second MgO layer, a trifunctional non-magnetic multilayered structure TriAF and a second hard layer HL below the cap layer.

Here the storage layer SAF SL, instead of being made of a composite ferromagnetic layer, is made of a synthetic antiferromagnetic layer SAF of the form ferromagnetic/non-magnetic/ferromagnetic in which the two ferromagnetic layers are antiferromagnetically coupled through the non-magnetic layer. The later can be made for instance of TriAF, Ta, W, Mo or Ru with thickness chosen so as to get antiferromagnetic coupling.

As well known by the man skilled in the art, when such SAF SL storage layer is used, the polarizer layer PL and the additional polarizing layer APL are then set in parallel magnetic configuration to get the maximum spin transfer efficiency.

Another object of the invention is a spintronic device comprising a synthetic antiferromagnetic SAF layer comprising a trifunctional layer TriAF according to the invention.

Such a device can be for example a Spin Transfer Torque Magnetic Random Access Memory STT-MRAM, a Spin Orbit Transfer Magnetic Random Access Memory SOT-MRAM, a Spin transfer oscillator, a spin-diode, a memristor or a magnetoresistive sensor.

For example, the magnetic tunnel junction of FIG. 5b is particularly adapted to a SOT-MRAM due to the accessibility of the storage layer SL.

The magnetic tunnel junctions described in FIGS. 5a, 6a, 6b, 8 and 9 are particularly adapted for STT-MRAM applications.

The invention claimed is:

1. A synthetic antiferromagnetic layer comprising:
a first ferromagnetic layer containing an amorphizing element, said first ferromagnetic layer having a first structural symmetry;
a second ferromagnetic layer having a second structural symmetry;
wherein the first and the second ferromagnetic layers are antiferromagnetically coupled by a trifunctional non-magnetic multi-layered structure, the antiferromagnetic coupling being an Ruderman-Kittel-Kasuya-Yosida (RKKY) coupling, said non-magnetic multi-layered structure comprising at least two non-magnetic layers, said non-magnetic multi-layered structure being at least partially nano-crystalline or amorphous in order to ensure a structural transition between the first ferromagnetic layer having the first structural symmetry and the second ferromagnetic layer having the second structural symmetry, said non-magnetic multilayered structure being adapted to absorb at least part of the amorphizing element out of the first ferromagnetic layer in contact with the non-magnetic multi-layered structure.

2. The synthetic antiferromagnetic layer according to claim 1, wherein the non-magnetic multilayered structure comprises at least a first and a second non-magnetic layer, the first non-magnetic layer comprising one of the following elements Ru, Re, Rh, Cu, Ir, Os or an alloy thereof and/or the second non-magnetic layer comprising one of the following elements W, Mo, Nb, Cu, Ta, V, Cr or an alloy thereof.

3. The synthetic antiferromagnetic layer according to claim 1, wherein a thickness of the first non-magnetic layer is lower than 2 nm.

4. The synthetic antiferromagnetic layer according to claim 3, wherein the thickness of the first non-magnetic layer is comprised between 0.2 nm and 0.9 nm.

5. The synthetic antiferromagnetic layer according to claim 1, wherein a thickness of the second non-magnetic layer is lower than 1 nm.

6. The synthetic antiferromagnetic layer according to claim 5, wherein the thickness of the second non-magnetic layer is comprised between 0.1 nm and 0.6 nm.

7. The synthetic antiferromagnetic layer according to claim 1, wherein the non-magnetic multi-layered structure comprises n bilayers, each bilayer comprising a first and a second non-magnetic layers.

8. A magnetic tunnel junction comprising the synthetic antiferromagnetic layer according to claim 1, a first tunnel barrier layer, a storage layer and a cap layer and/or a second tunnel barrier layer added in contact with the storage layer on its interface opposite to the first tunnel barrier layer.

9. The magnetic tunnel junction according to claim 8, wherein the first and second tunnel barrier layers are MgO layers.

10. The magnetic tunnel junction according to claim 8, wherein the storage layer is a composite storage layer, said composite storage layer comprising a stack formed by at least a first ferromagnetic layer, a non-magnetic layer or multilayer and a second ferromagnetic layer, said first and second ferromagnetic layers comprising at least one of the following alloys CoFeB, FeB, CoFe and the non-magnetic layer or multilayer being adapted to absorb the amorphizing element and comprising at least one of the following elements Ta, W, Mo, Ru or an alloy thereof.

11. The magnetic tunnel junction according to claim 8, comprising an additional magnetic layer added in contact with the second tunnel barrier layer and/or an additional synthetic antiferromagnetic layer in contact with the second tunnel barrier layer.

12. The magnetic tunnel junction according to claim 11, wherein the additional synthetic antiferromagnetic layer comprises an additional trifunctional non-magnetic multi-layered structure.

13. The magnetic tunnel junction according to claim 11, wherein the storage layer is formed by a synthetic antiferromagnetic layer.

14. A spintronic device comprising a synthetic antiferromagnetic layer SAF according to claim 1.

* * * * *